United States Patent
Vierthaler

(10) Patent No.: US 6,573,697 B2
(45) Date of Patent: *Jun. 3, 2003

(54) METHOD AND APPARATUS FOR DETERMINING THE ENERGY OF A SIGNAL

(75) Inventor: Matthias Vierthaler, Freiburg (DE)

(73) Assignee: Micronas GmbH, Freiburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/812,232

(22) Filed: Mar. 19, 2001

(65) Prior Publication Data

US 2002/0101228 A1 Aug. 1, 2002

Related U.S. Application Data

(63) Continuation of application No. 09/412,921, filed on Oct. 5, 1999, now Pat. No. 6,232,762.

(30) Foreign Application Priority Data

Oct. 10, 1998 (DE) .......................................... 198 46 787

(51) Int. Cl.⁷ ...................... G01R 23/165; G01R 31/08; G01R 31/11; G01R 1/04; G01N 27/00
(52) U.S. Cl. ..................... 324/76.44; 324/532; 324/533; 324/158.1; 324/558
(58) Field of Search ............................. 324/76.44, 532, 324/533, 158.1, 558; 379/388.01; 704/258

(56) References Cited

U.S. PATENT DOCUMENTS 5,506,934 A * 4/1996 Kawama ..................... 704/258
6,125,179 A * 9/2000 Wu ........................ 379/388.01
6,232,762 B1 * 5/2001 Vierthaler ................. 324/76.44

FOREIGN PATENT DOCUMENTS

| DE | 44 23 763 C1 | 2/1996 |
| DE | 196 13 736 C1 | 8/1997 |
| WO | WO 96/00906 | 1/1996 |

* cited by examiner

*Primary Examiner*—Christine Oda
*Assistant Examiner*—Wasseem H. Hamdan
(74) *Attorney, Agent, or Firm*—Samuels, Gauthier & Stevens, LLP

(57) ABSTRACT

The invention describes two alternative methods and corresponding devices for producing an energy signal $y_n$ whose amplitude values represent the energy of an electrical signal $s_n$. A first method and the corresponding device calculate the energy signal $y_n$ according to the equation $$y_n = \frac{tau \cdot s_n^2}{2 \cdot y_{n-1}} + \left(1 - \frac{tau}{2}\right) \cdot y_{n-1}$$

while a second method and the corresponding device are based on the equation, $$y_n = y_{n-1} + \frac{tau}{2 y_{n-1}}(s_n^2 - y_{n-1}^2)$$

where tau is a specified parameter and n represents the clock pulse.

4 Claims, 2 Drawing Sheets

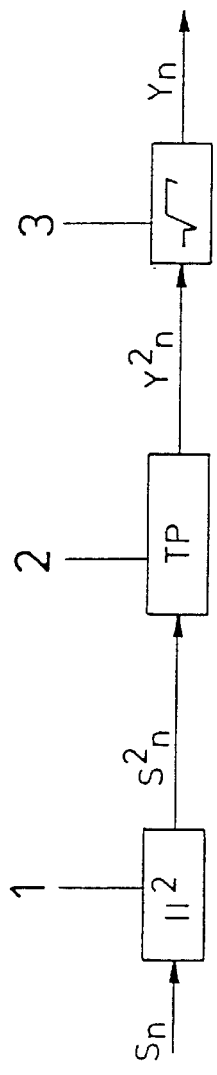
FIG 4a - PRIOR ART
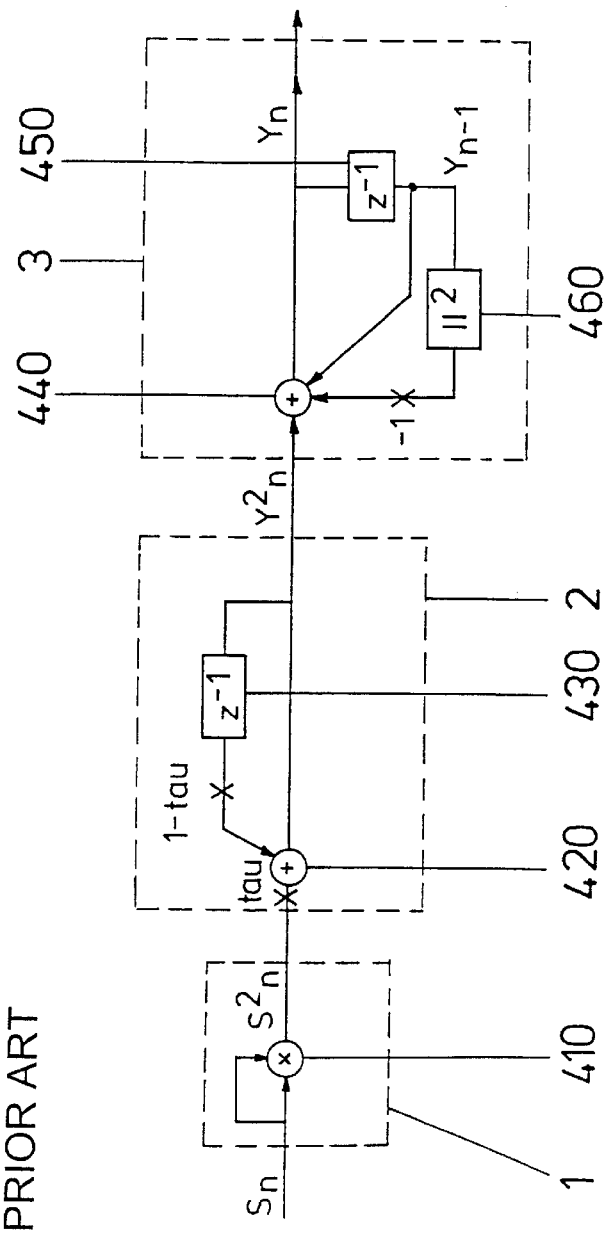
FIG 4b - PRIOR ART

METHOD AND APPARATUS FOR DETERMINING THE ENERGY OF A SIGNAL

CROSS REFERENCE TO RELATED APPLICATION

This application is a continuation of application Ser. No. 09/412,921 filed Oct. 5, 1999, now U.S. Pat. No. 6,232,762.

BACKGROUND OF THE INVENTION

The present invention relates to the field of signal processing, and in particular to apparatus and method for determining the energy of a signal.

An ideal exponentially weighted root mean square (ERMS) detector for determining the energy of an analog signal s(u) is well known from the theory of electrical signal processing. The energy may be determined sequentially by executing three method steps: squaring the signal, integrating the squared signal, and extracting the root of the integrated signal. These method steps are also reflected in the following equation:

$$y(s(u),t) = \sqrt{\frac{1}{T}\int_{-\infty}^{t} s^2(u) \cdot e^{-\frac{(t-u)}{T}} du}$$

which describes the functional principle of the ideal analog detector. The detector determines the energy y of the signal s(u) as its RMS value, weighted exponentially with a time constant T, as a function of time t.

The conventional digital ERMS detectors receive a digital signal $s_n$ at their input in order to deliver a digital energy signal $y_n$ from the output, with the amplitude values of the energy signal representing the energy of the signal $s_n$. They are based on method steps known from theory. To convert these method steps, as a rule as shown in FIG. 4a, they are formed as a series circuit consisting of a squaring element 1, a low-pass filter 2, and a root extractor 3.

FIG. 4b shows one possible digital implementation for such a series circuit. Accordingly, squaring element 1 is formed from a first multiplying element 410 that multiplies the digital signal $s_n$ by itself in order to provide the squared signal $s^2n$ and its output. The squared signal is then supplied as the input signal to the digital low-pass 2 weighted with a factor tau.

Within the low-pass 2, the input signal is fed as a first summand to an adding element 420 which delivers at its output the desired energy signal but squared as $y^2n$. As the second summand, the output signal $y^2n$ fed back through a state memory 430 weighted with the factor (1–tau) is supplied to adding element 420.

Then the squared energy signal $y^2n$ is subjected to a root extractor 3. The root extractor 3 comprises a second adding element 440 that receives the squared energy signal $y^2n$ and outputs the desired energy signal $y_n$ at its output. To calculate the energy signal $y_n$, adding element 440 adds the squared energy signal to two additional signals. These are firstly the energy signal $y^2_{n-1}$ fed back through a second state memory 450 from its own output and secondly a signal $y^2_{n-1}$ that is obtained by squaring and negating from the fed-back energy signal $y_{n-1}$.

The conventional calculation of the energy signal $y_n$ shown here suffers from the following disadvantages:

By squaring the signal $s_n$, its dynamic range is sharply increased. It is only possible to store the squared signal in a memory with a very large word width.

The square root routines used in conventional extraction of square roots converge slowly, often as a function of the magnitude of the amplitude of their input signal. They are therefore unsuitable for use in systems that require rapid convergence behavior of the detector, such as compander-expander systems for example.

SUMMARY OF THE INVENTION

An objective of the invention is to improve the methods and devices according to the species for determining the energy of a signal in such fashion that they exhibit faster convergence behavior and reduced computation cost, as well as less storage space.

According to a first embodiment of the method according to the invention, an energy signal $y_n$ is calculated whose amplitude values represent the energy of signal $s_n$, according to the equation $$y_n = \left(\frac{tau * s_n^2}{2 * y_{n-1}}\right) + \left(\left(1 - \frac{tau}{2}\right) * y_{n-1}\right) \quad (1)$$

with tau: a specified parameter and n: the clock pulse, whereby in Equation 1 the method steps of squaring, low-pass filtration, and root extraction are combined.

The parameter tau determines the time constant for the exponential weighting. It bears the following relationship approximately with the time constant T in the analog formula:

$$tau = \left|\frac{(0.5)*\left(1 - e^{\left(\frac{i}{T*fs}\right)}\right)}{\left(0.5 - e^{\left(\frac{i}{T*fs}\right)}\right)}\right|$$

where:

i=sqrt(−1)

fs=sampling frequency of the digital system.

Example with fs 48 kHz and T=20 ms, tau is approximately 0.00104.

The explanations of the parameters tau and n likewise apply to all the following equations in the specification.

In the method performed according to Equation 1, the integrated method step of extracting the root exhibits a quadratic convergence behavior which has a very advantageous effect on the dynamic behavior of the entire process.

In addition, the method step of root extraction in the step of low-pass filtration is integrated, so that the calculation expense is reduced.

To work the method, it is no longer necessary to store the squared signal $s^2n$ with its large dynamic range; instead, it is sufficient to store the amplitude values found for the energy signal $y_n$, which, because of the fact that the root has been extracted, exhibit a value range considerably reduced by comparison with the dynamic range of the squared signal $s^2n$. For this reason, in the method according to the invention, a memory with a relatively small word width can be used.

According to one advantageous improvement on the method, the calculation of the first summand in Equation 1 includes the step "multiply signal $s_n$ by an auxiliary signal $tau/2y_{n-1}$ to obtain a product signal" and "multiply the product signal by the signal $s_n$" or alternatively the steps "square the signal $s_n$" and "multiply the squared signal $s^2n$ by the auxiliary signal tau/2$y_{n-1}$". Depending on the selected implementation of the method, one alternative or the other can contribute to reducing the computation and storage cost.

The advantages given for the first embodiment of the method according to the invention apply similarly to a corresponding device.

It is advantageous for the corresponding device according to the invention to have an inverter to receive the energy signal $y_n$ and to output an inverted signal $b_n$=tau/2$y_n$, designed so that it, by the equation $$b_n = b_{n-1} * \frac{2k}{tau} * \left(\left(\frac{(1+k)*tau}{2k}\right) - (b_{n-1} * y_n)\right) \quad (2)$$

with k: a constant preferably between 0.5 and 1, it provides the specified link between the inverted signal $b_n$ and the energy signal $y_n$. The convergence behavior of the inverter can be influenced by the choice of the constant k; in this manner, the quadratic convergence behavior of the entire device can be optimized as well.

The explanation for the constant k likewise applies to all the following equations in the specification.

According to a second embodiment of the method according to the invention, the goal is achieved especially by virtue of the fact that the energy signal $y_n$ is calculated according to the equation $$y_n = \left(\frac{tau * s_n^2}{2 * y_{n-1}}\right) + \left(\left(1 - \frac{tau}{2}\right) * y_{n-1}\right) \quad (3)$$

with the method steps of squaring, low-pass filtering, and root extraction being combined in Equation 3.

In the method performed according to Equation 3, the method step of root extraction exhibits a quadratic convergence behavior, which has a highly advantageous effect on the dynamic behavior of the entire method.

In addition, the method step of low-pass filtration is integrated in the step of root extraction, so that calculation cost is reduced.

To work the method, it is no longer necessary to store the squared signal s²n with its wide dynamic range; instead, it is sufficient to store the currently determined value for the energy signal $y_n$, which, because of the root extraction that has been performed, has a value range that is considerably reduced by comparison with the dynamic range of the squared signal s²n. For this reason, in the method according to the invention, a memory with a much reduced word width can be used.

The listed advantages of the second embodiment of the method according to the invention also apply to a corresponding device.

For the device according to the second embodiment, it is likewise advantageous for the reasons given for it to have the inverter described above.

These and other objects, features and advantages of the present invention will become more apparent in light of the following detailed description of preferred embodiments thereof, as illustrated in the accompanying drawings.

BRIEF DESCRIPTION OF THE DRAWING

FIG. 1b is an alternative embodiment of the detector according to FIG. 1a;

FIG. 4a is a block diagram of a prior art detector; and

FIG. 4b is an implementation of the prior art detector from FIG. 4a.

DETAILED DESCRIPTION OF THE INVENTION

A detailed description of the two preferred embodiments of the invention follow, with reference to FIGS. 1a, 1b, 2, and 3.

Figure 1A:
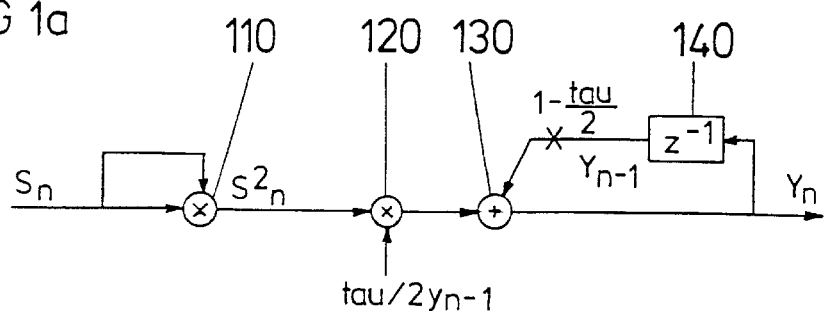
FIG. 1a implementation of a detector according to a first embodiment.

The first embodiment of a detector according to the invention, shown in FIG. 1a, calculates an energy signal $y_n$ whose amplitude values represent the energy of the signal $s_n$ according to the following equation:

$$y_n = \left(\frac{tau * s_n^2}{2 * y_{n-1}}\right) + \left(\left(1 - \frac{tau}{2}\right) * y_{n-1}\right). \quad (1)$$

For hardware or software implementation of Equation 1, the detector has a first multiplying element 110 and a second multiplying element 120, an adding element 130, and a state memory 140.

The input signal $s_n$ is supplied to two inputs of the first multiplying element 110 so that the squared input signal s²n is available at its output. The squared signal is then fed to the second multiplying element 120 that multiplies it by an auxiliary signal tau/2$y_{n-1}$. A product signal calculated by the second multiplying element 120 is supplied to a first input of adding element 130, which provides the energy signal $y_n$ to be determined at its output. To calculate the energy signal $y_n$, the latter is fed back through state memory 140, weighted with a factor 1-tau/2, to a second input of adding element 130.

With the first embodiment of the detector according to the invention wired in this fashion, a low-pass filter is obtained in which a root extractor is integrated.

Figure 1B:
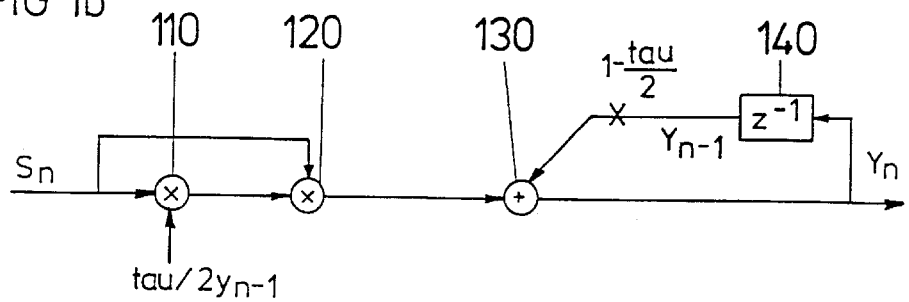

An alternative design, shown in FIG. 1b, of the first embodiment of the detector differs from the design according to FIG. 1a only in the wiring of the two multipliers 110 and 120. According to the alternative design according to FIG. 1b, the multiplying element 110 multiplies the signal $s_n$ initially by the auxiliary signal tau/2$y_{n-1}$. The product signal at the output of the first multiplying element is then supplied to multiplying element 120, which multiplies the product signal times the signal $s_n$.

In the alternative designs of the detector according to FIGS. 1a and 1b, the product signals at the outputs of the second multiplier 120 are identical.

Figure 2:
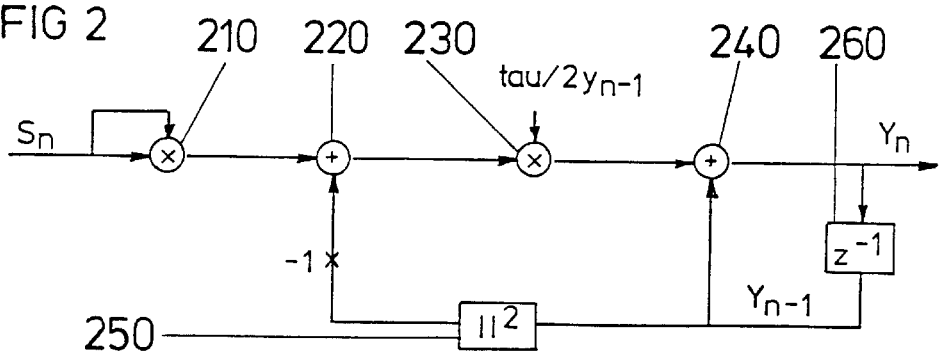
FIG. 2 is an implementation of a detector according to a second embodiment.

According to the second embodiment of the detector shown in FIG. 2, an energy signal $y_n$ whose amplitude values represent the energy of a signal, $s_n$ are calculated according to the following equation:

$$y_n = y_{n-1} + \frac{tau}{2y_{n-1}}(s_n^2 - y_{n-1}^2). \quad (3)$$

For hardware or software implementation of Equation 3, the detector according to the second embodiment has a first multiplying element 210 and a second multiplying element 230, a first adding element 220 and a second adding element 240, a state memory 260, and a squaring element 250.

The signal $s_n$ is supplied to the two inputs of the first multiplying element 210, so that the squared signal $s_n^2$ is provided at the output of the first multiplying element. The squared signal is delivered to a first input of the first adding element 220 whose output signal is supplied to the second multiplying element 230. The second multiplying element 230 multiplies the output signal of the adding element 220 times the auxiliary signal tau/$2y_{n-1}$ and delivers the resultant product signal to a first input of the second adding element 240, which delivers the energy signal $y_n$ to be produced at its output. The output signal of adding element 240 is fed back through the state memory 260 to a second input of the second adding element,240. In addition, the output signal $y_{n-1}$ of the state memory 260 is fed back following negation through the squaring element 250 connected downstream to the second input of the first adding element 220.

With the second embodiment of the detector according to the invention wired in this fashion, a root extractor is formed into which a low-pass filter is integrated.

Figure 3:
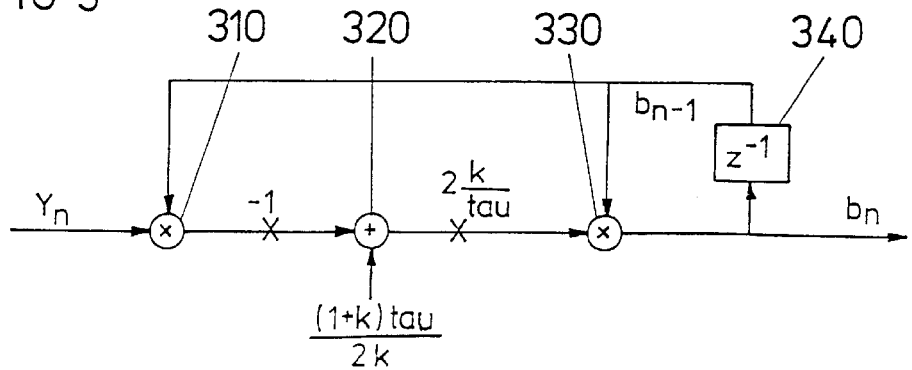
FIG. 3 is an implementation of an inverter according to the invention.

FIG. 3 shows the implementation of an inverter for converting the energy signal $y_n$ into a signal $b_n$=tau/$2y_n$. The inversion takes place according to the invention by the following equation:

$$b_n = b_{n-1} * \frac{2k}{tau} * \left( \left( \frac{(1+k)*tau}{2k} \right) - (b_{n-1} * y_n) \right). \quad (2)$$

For a hardware or software implementation of Equation 2, the inverter has a first multiplying element 310 and a second multiplying element 330, an adding element 320, and a state memory 340.

The first multiplying element 310 multiplies the received energy signal $y_n$ by the output signal $b_n$ from the inverter fed back via the state memory 340. The output signal of the first multiplying element 310 is negated and supplied to adding element 320, which adds it to the summand (1+k)*(tau/2k). The sum signal at the output of adding element 320 is weighted with the factor 2k/tau and supplied to the second multiplying element 330, that multiplies it by the output signal $b_{n-1}$ of the state memory 340. At the output of the second multiplying element 330, the output signal $b_n$ from the inverter is provided, and supplied simultaneously to the state memory 340 as an input signal.

The following is true of all versions of the ERMS detector:

The method supplies inaccurate results if $y_n$ suddenly rises sharply, so that: $y_n$>(c*$y_{n-1}$). Here c is a constant which can be chosen depending on the desired accuracy. A good accuracy is obtained with c<1.5.

In order to improve the accuracy in this case, the following iterations can be performed as well. This is necessary only with an abrupt change in signal energy and strict requirements for accuracy. This results in the following modification:

$$y_{n,m} = tau \cdot \frac{s_n^2}{2y_{n,m-1}} + \left(1 - \frac{tau}{2}\right) \cdot y_{n-1} \text{ and}$$

$$y_{n,m} = y_{n-1} + \frac{tau}{2y_{n,m-1}}(s_n^2 - y_{n-1}^2)$$

where:
m=additional iteration index.
The iterations are continued until $$\frac{1}{c} < \left| \frac{y_{n,m}}{y_{n,m-1}} \right| < c$$

As a rule, even with sharp jumps in the input signals, two to three iterations will suffice.

Although the present invention has been shown and described with respect to several preferred embodiments thereof, various changes, omissions and additions to the form and detail thereof, may be made therein, without departing from the spirit and scope of the invention.

What is claimed is:

1. A method for determining the energy of an input signal ($s_n$), comprising the steps of:
   squaring the input signal ($s_n$) and providing a squared signal ($s^2n$) indicative thereof;
   processing said squared signal ($s^2n$) to produce an energy signal ($y_n$) indicative of the energy of the input signal ($s_n$), according to the following difference equations,
   such that the energy signal ($y_n$) can be expressed as:

$$y_n = \left(\frac{tau * s_n^2}{2 * y_{n-1}}\right) + \left(\left(1 - \frac{tau}{2}\right) * y_{n-1}\right)$$

wherein tau is a specified parameter and n is a clock pulse number.

2. A device for determining the energy of an input signal ($s_n$), comprising:
   a squaring element that determines the square of receives the input signal ($s_n$), and provides a squared signal ($s^2n$) indicative thereof;
   means for processing said squared signal ($s^2n$) to provide an energy signal ($y_n$) indicative of the energy of the input signal ($s_n$), wherein said energy signal ($y_n$) can be expressed as, $$y_n = \left(\frac{tau * s_n^2}{2 * y_{n-1}}\right) + \left(\left(1 - \frac{tau}{2}\right) * y_{n-1}\right)$$

wherein tau is a specific parameter and n is a clock pulse number.

3. A method for determining the energy of an input signal ($s_n$), comprising the steps of:
   computing the square of the input signal ($s_n$) and providing a squared signal ($s^2n$) indicative thereof;
   processing said squared signal ($s^2n$) to produce an energy signal ($y_n$) indicative of the energy of the input signal ($s_n$), according to the following difference equations,
   such that the energy signal ($y_n$) can be expressed as $$y_n = y_{n-1} + \frac{tau}{2y_{n-1}}(s_n^2 - y_{n-1}^2)$$

wherein tau is a specified parameter and n is a clock pulse number.

4. A device for determining the energy of an input signal ($s_n$), comprising:
   a squaring element that receives the input signal ($s_n$), computes the square and provides a squared signal ($s^2n$) indicative thereof;
   means for processing said squared signal ($s^2n$) to provide an energy signal ($y_n$) indicative of the energy of the input signal ($s_n$), wherein said energy signal ($y_n$) can be expressed as, $$y_n = y_{n-1} + \frac{tau}{2y_{n-1}}(s_n^2 - y_{n-1}^2)$$

wherein tau is a specified parameter and n is the clock pulse.

* * * * *